United States Patent [19]
Yuan et al.

[11] Patent Number: 6,111,533
[45] Date of Patent: Aug. 29, 2000

[54] CMOS ANALOG-TO-DIGITAL CONVERTER AND TEMPERATURE SENSING DEVICE USING THE SAME

[75] Inventors: Chung-Pin Yuan, Yangmei; Tsen-Shau Yang, Taipei, both of Taiwan

[73] Assignee: Myson Technology, Inc., Hsin-Chu, Taiwan

[21] Appl. No.: 09/095,024

[22] Filed: Jun. 9, 1998

[30]     Foreign Application Priority Data

Jan. 19, 1998 [CN]  China ..................................... 87100758

[51] Int. Cl.[7] ...................................................... H03M 1/66
[52] U.S. Cl. ........................................... 341/157; 341/155
[58] Field of Search ..................................... 341/157, 142, 341/143, 172, 155

[56]     References Cited

U.S. PATENT DOCUMENTS

| | | | |
|---|---|---|---|
| 3,833,903 | 9/1974 | Gordon et al. | 341/157 |
| 4,025,868 | 5/1977 | Miki et al. | 341/157 |
| 4,366,468 | 12/1982 | Yoneyama | 341/157 |
| 4,435,697 | 3/1984 | Takahashi | 341/157 |
| 4,471,340 | 9/1984 | Lewis | 341/157 |
| 4,521,763 | 6/1985 | Murao et al. | 341/157 |

*Primary Examiner*—Michael Tokar
*Assistant Examiner*—Jean B. Jeanglaude
*Attorney, Agent, or Firm*—Bacon & Thomas, PLLC

[57]     ABSTRACT

An analog-to-digital converter receives slow-varying analog voltages from a sensing device and converts the slow-varying analog voltages to digital signals. The sensing device generates a slow-varying analog voltage directly proportional to absolute temperature. The analog-to-digital converter includes a second counter which receives the pulse train from the second voltage controlled oscillator that counts the number of pulses which informs the first counter whenever the count value thereof reaches a fixed number and resets the count value thereof to zero. As the first counter is being informed by the second counter, its count value is read and then reset to zero. The read count represents a digital signal corresponding to the slow-varying analog voltages input.

9 Claims, 8 Drawing Sheets

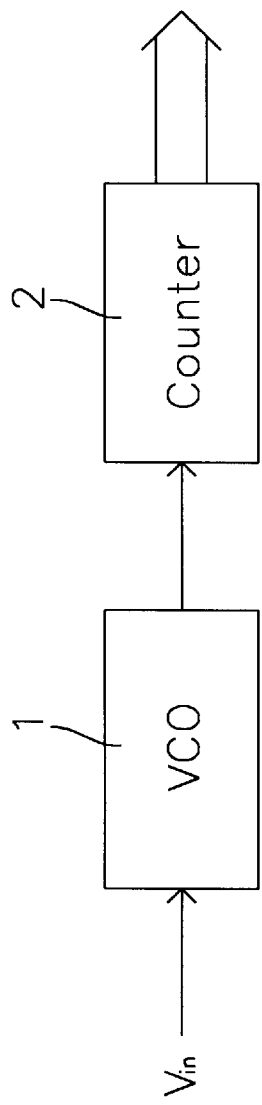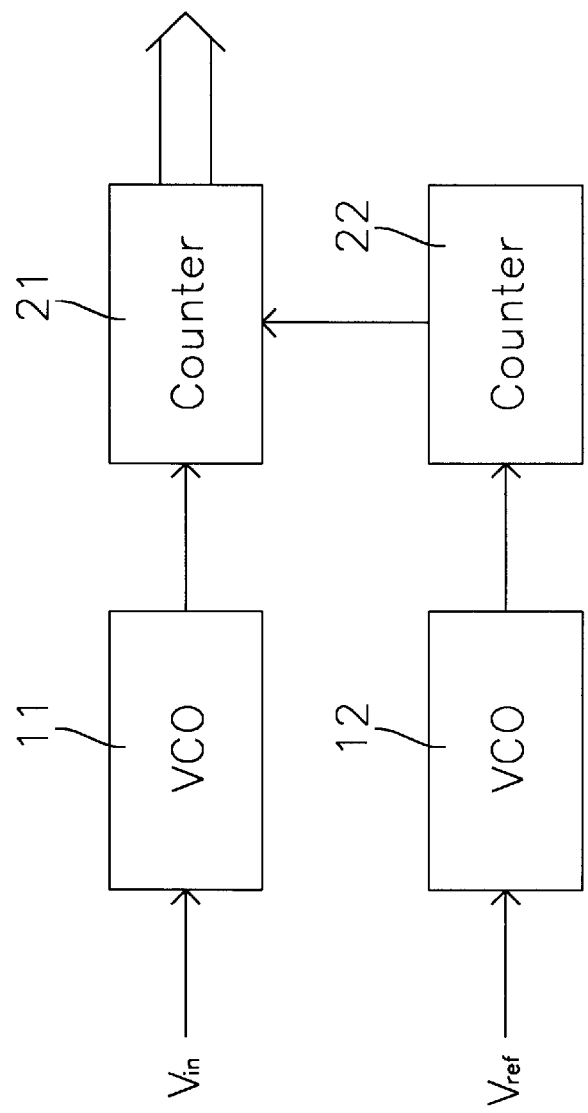

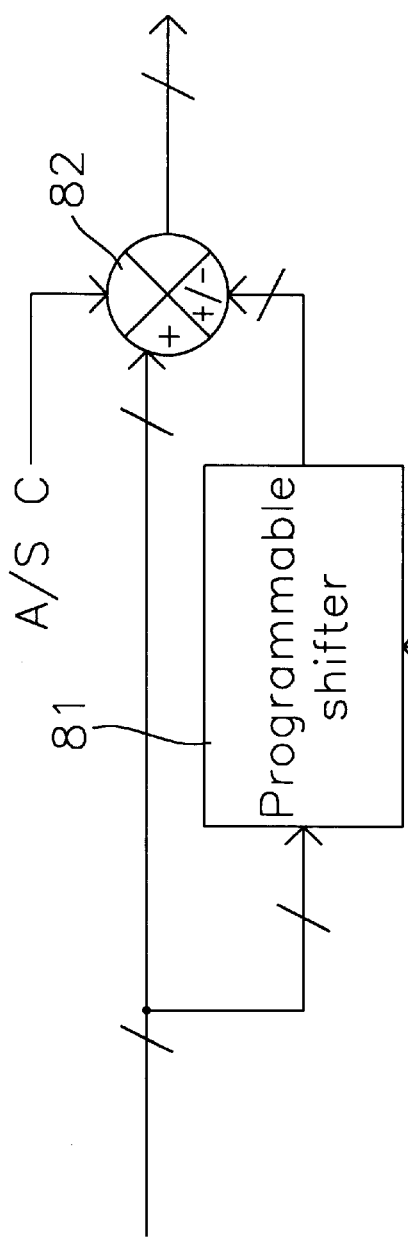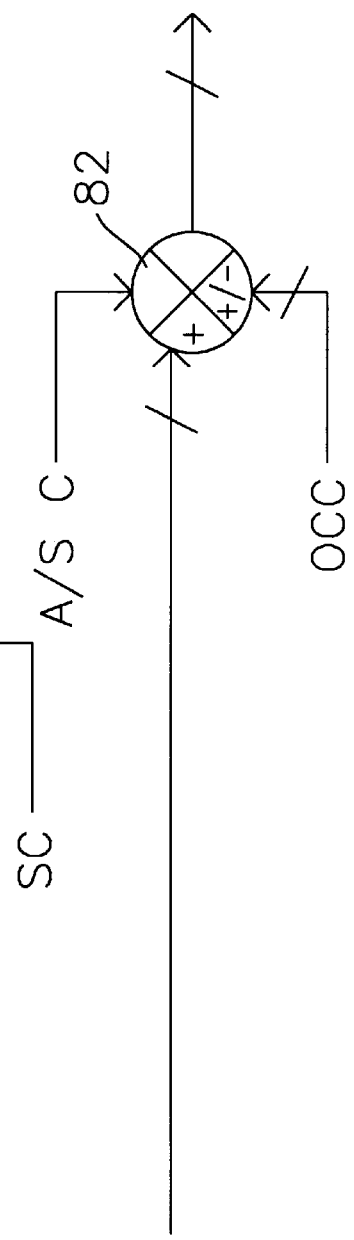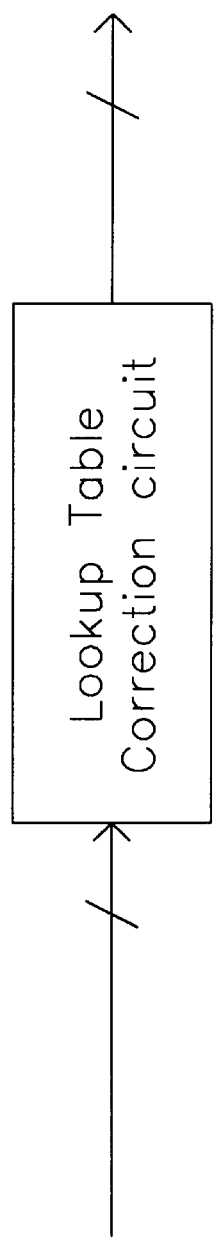

CMOS ANALOG-TO-DIGITAL CONVERTER AND TEMPERATURE SENSING DEVICE USING THE SAME

BACKGROUND OF THE INVENTION

The present invention relates generally to a CMOS analog-to-digital converter (ADC) and a temperature sensing device using the converter, and more particularly to an apparatus for converting an analog voltage or temperature to a digital signal by using voltage controlled oscillators (VCOs) and counters.

To enable a digital system to perform environmental monitoring and processing, it is necessary to convert an analog signal such as supply voltage or temperature to a digital signal. To convert analog voltage signals into digital signals, the "sample and convert" approach is utilized in conventional technologies, in which complicated circuits and larger areas are required. To achieve temperature sensing, thermal resistors, which are not compatible with the standard CMOS digital IC manufacturing process and are not adapted for monolithic structures, are employed.

Sigma-Delta conversion is an advanced analog/digital conversion technique developed in recent years. It utilizes low resolution oversampling of analog signals, and then employs feedback and digital filtering techniques to convert the presentation with a high sampling rate but low accuracy into the presentation with a low sampling rate but high accuracy; parametric requirements of the analog circuit are thereby reduced at the expense of circuit complexity and device size.

The aforementioned conventional technologies are disadvantageous in circuit complexity, wafer area and manufacturing cost, which can be improved dramatically by utilizing the fact that supply voltages and environmental temperatures are all slow-varying analog signals.

OBJECT OF THE INVENTION

In view of this, it is therefore an object of the present invention to provide a CMOS analog-to-digital converter and a temperature sensing device using the converter, in which voltage controlled oscillators and counters are used to convert analog voltages and temperature into digital signals. The present invention is advantageous in many respects. For example, the circuit is simple, accuracy is high, it is compatible with the standard CMOS digital IC manufacturing process and cost is low. In addition, the temperature sensing device in accordance with the present invention is adapted for monolithic structure.

SUMMARY OF THE INVENTION

The simplest aspect of the CMOS analog-to-digital converter of the present invention for converting slow-varying analog voltage signals into digital signals is shown in FIG. 1, which includes: a voltage controlled oscillator 1 for receiving an input analog voltage signal and converting it into a pulse train; and a counter 2 which receives the pulse trains from the voltage controlled oscillator 1, counts the number of the pulses and resets the count value to zero at every fixed interval T. The count value of the counter 2 is read at every fixed interval T immediately before it is reset to zero, which is used to represent the digital signal corresponding to the input analog signal.

The aforementioned CMOS analog-to-digital converter further includes a linearity correction circuit which can correct linearity errors.

The CMOS analog-to-digital converter further includes an offset correction circuit which can correct offset errors.

The CMOS analog-to-digital converter further includes a look-up table correction circuit which can correct hybrid errors.

A CMOS temperature sensing device according to the present invention, which uses the aforementioned CMOS analog-to-digital converter, operates as follows: it generates an analog voltage directly proportional to the absolute temperature, then inputs the analog voltage to the above CMOS analog-to-digital converter; a digital signal representing temperature thus can be read at the output terminal of the analog-to-digital converter.

The implementation of the present invention will be further illustrated with the following preferred embodiments made with reference to the accompanied drawings.

BRIEF DESCRIPTION OF THE DRAWINGS

FIG. 1 shows a block diagram of the first aspect of the CMOS analog-to-digital converter according to the present invention;

FIG. 2 shows a block diagram of the second aspect of the CMOS analog-to-digital converter according to the present invention;

FIG. 8A, FIG. 8B, FIG. 8C show the schematic diagrams of three correction circuits for correcting the output digital signal of the analog-to-digital converters in FIG. 1, FIG. 2 or FIG. 3;

DESCRIPTION OF THE PREFERRED EMBODIMENT

The preferred embodiment is for slow-varying analog voltage signals, although the embodiment shown in FIG. 1 can be utilized to perform analog-to-digital conversion. It is disadvantageous, however, in that the mapping function of output to input is difficult to determine precisely while the VCO is fabricated in IC form.

FIG. 2 shows another preferred embodiment which includes: a VCO 11 which receives an input analog voltage Vin and converts it into a pulse train; a counter 21 which receives the pulse train from the VCO 11 and counts the number of pulses; a VCO 12 having the same characteristics as the VCO 11, which receives a reference voltage Vref and converts it into a pulse train; and a counter 22 which receives the pulse train from the VCO 12, counts the number of pulses, sends a signal to the counter 21 whenever the count value reaches a fixed number and then resets the count value to zero.

When the counter 21 receives the signal from the counter 22, its count is read and then reset to zero. This readout count represents a digital signal corresponding to the input analog signal.

Compared with the first aspect, the second aspect is advantageous in that the mapping functions of VCO 11 and 12 need not be determined precisely provided that the two VCOs have the same mapping characteristics. By using the IC process, it is easy to achieve the purpose that a plurality of elements on the same chip are reasonably matched. However, there is still a restriction for the second aspect, which is described as follows. The A/D conversion function of the second aspect depends on the degree of how the mapping characteristics of the two VCOs match each other and it is generally accepted that IC element matching is a function of the element area; elements that are larger in area match better than elements of smaller area. Therefore, reduction of area is constrained for the second aspect of the analog-to-digital converter.

Figure 3:
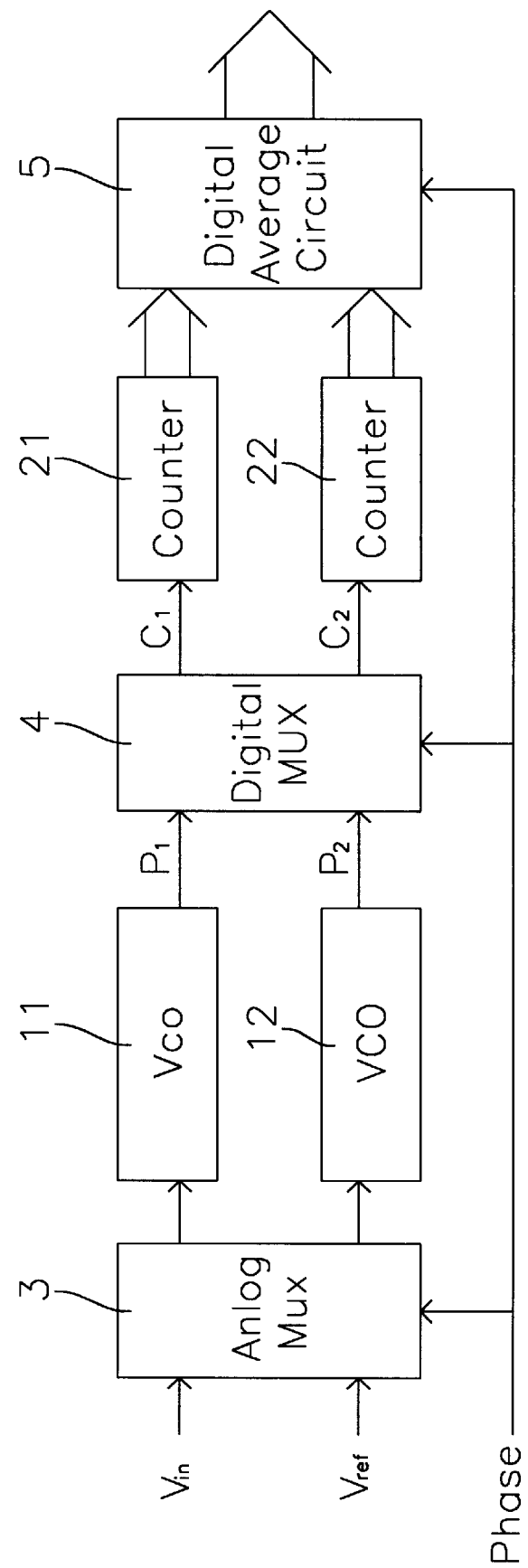
FIG. 3 shows a block diagram of the third aspect of the CMOS analog-to-digital converter according to the present invention.

FIG. 3 shows the third aspect of the analog-to-digital converter, by which the limit of area reduction is greatly reduced. The analog-to-digital converter includes: an analog multiplexer (MUX) pair 3, the VCOs 11 and 12, a digital multiplexer pair 4, the counters 21 and 22, and a digital average circuit 5.

The analog multiplexer pair 3 includes a first analog multiplexer and a second analog multiplexer wherein the first analog multiplexer receives two signals: an input voltage Vin and a reference voltage Vref, controlled by a control signal Phase. The second analog multiplexer also receives the two signals Vin and Vref, and is controlled by the complement of the signal Phase. When the control signal Phase is high, the output signals of the first analog multiplexer and second analog multiplexer are Vin and Vref, respectively; when the control signal Phase is low, the output signals of the first analog multiplexer and second analog multiplexer are Vref and Vin, respectively.

The VCOs 11 and 12 receive the output signals from the first analog multiplexer and second analog multiplexer, respectively, and output pulse trains P1 and P2, respectively.

The digital multiplexer pair 4 includes a first digital multiplexer and a second digital multiplexer, wherein the first digital multiplexer receives the digital signals P1 and P2 and is controlled by the control signal Phase; the second digital multiplexer also receives the signals P1 and P2 and is controlled by the complement of the signal Phase. When the control signal Phase is high, the output signals C1 and C2 of the first digital multiplexer and second digital multiplexer are P1 and P2, respectively; when the control signal Phase is low, the output signals C1 and C2 of the first digital multiplexer and second digital multiplexer are P2 and P1, respectively.

The counter 21 receives the output signal from the first digital multiplexer; the counter 22 receives the output signal from the second digital multiplexer.

The digital average circuit 5, which receives the output signals of the counters 21 and 22 and receives the control signal Phase, operates as follows: (1) while the control signal Phase is high, the count value of the counter 21 is stored whenever the count value of the counter 22 reaches a fixed number, and then the two count values are reset to zero; (2) while the control signal Phase is low, the count value of the counter 22 is added to the stored count value of the counter 21 whenever the count value of the counter 21 reaches the fixed number; the count value of the counter 22 is added to the stored count value of the counter 21, then the sum is read and the counts of the counters 21 and 22 are reset to zero. This readout count represents a digital signal corresponding to the input analog signal.

When the two VCOs do not match each other completely, the third aspect exhibits its superiority over the second aspect, which is illustrated as follows. Let the mapping characteristics of the VCOs 11 and 12 be f1(x) and f2(x), respectively. Since f1(x) and f2(x) are reasonably close, assume that:

$$f1(x)=f(x)+0.5\Delta f(x); \quad f2(x)=f(x)-0.5\Delta f(x).$$

When Phase is high, $$C1=(f(Vin)+0.5\Delta f(Vin))/(f(Vref)-0.5\Delta f(Vref)). \quad (1)$$

When Phase is low, $$C2=(f(Vin)-0.5\Delta f(Vin))/(f(Vref)+0.5\Delta f(Vref)). \quad (2)$$

Thus the readout value $$C1+C2=(2\times f(Vin)\times f(Vref)+0.5\Delta f(Vin)\times \Delta f(Vref))/(f(Vref)\times f(Vref)-\Delta f(Vref)\times \Delta f(Vref)). \quad (3)$$

Note that Eq. (3) contains no first order error terms. If we ignore the second order error terms, then $$C1+C2=2\times (f(Vin)/f(Vref)). \quad (4)$$

Eq. (4) is exactly the correct result.

Figure 4:
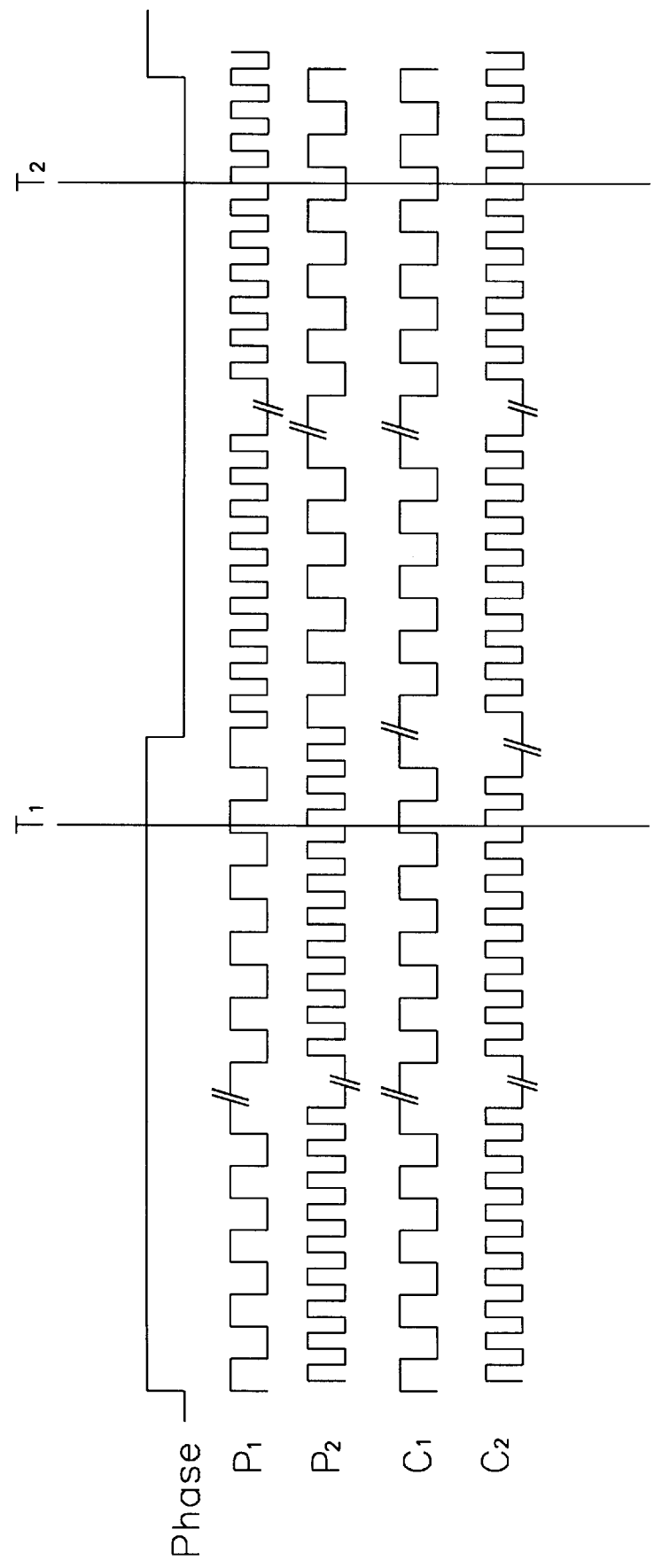
FIG. 4 illustrates a timing chart of various signals in the circuit shown in FIG. 3.

FIG. 4 illustrates a timing chart of various signals: Phase, P1, P2, C1 and C2, according to the third aspect shown in FIG. 3. While the control signal Phase is high, the count value of the counter 21 is stored in the digital average circuit 5 as the count value of the counter 22 reaches a fixed number (denoted by time T1). While the control signal Phase is low, the count value of the counter 22 is also stored in the digital average circuit 5 as the count value of the counter 21 reaches a fixed number (denoted by time T2), in which the two stored count values are added up and the result is regarded as the output digital signal.

Figure 5:
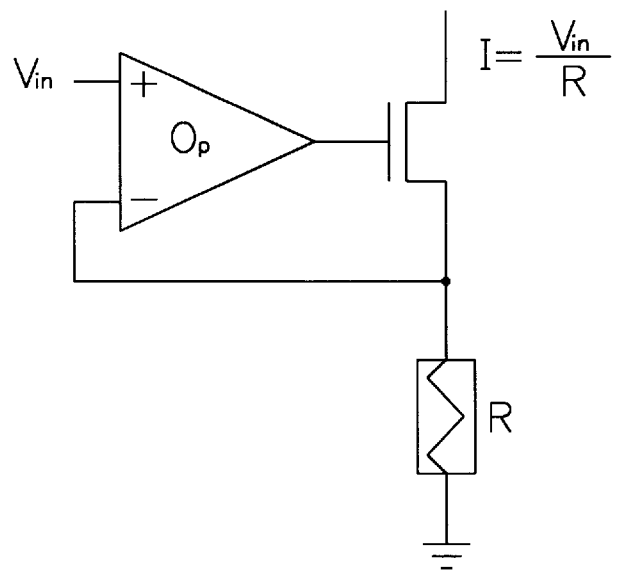
FIG. 5 shows a voltage/current converter.
Figure 6:
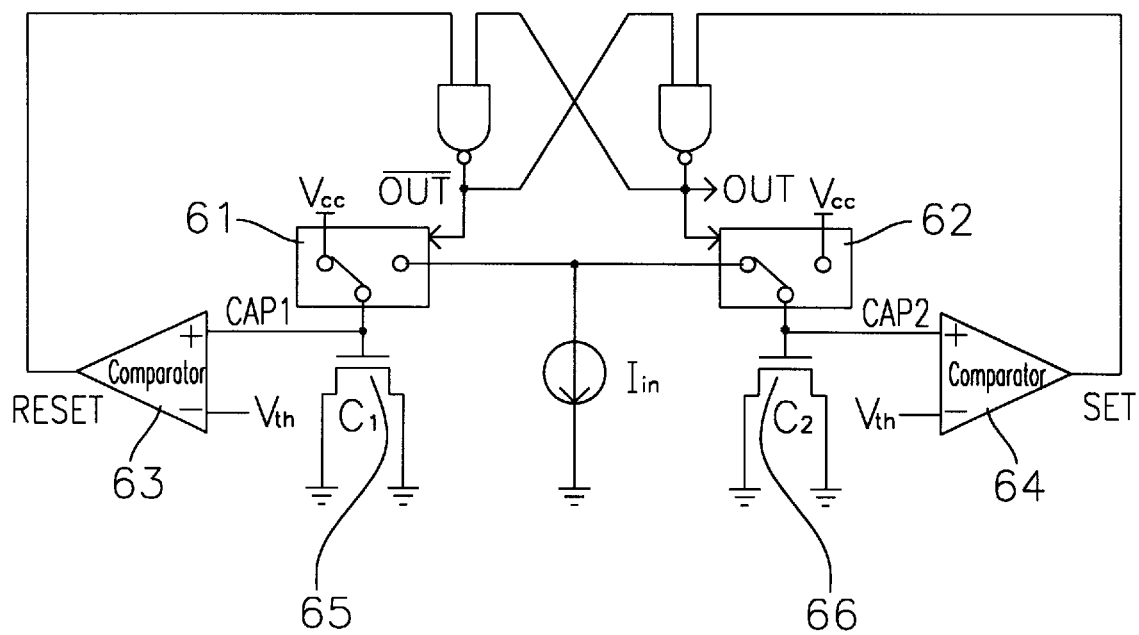
FIG. 6 shows a current controlled oscillator, which can be connected to the voltage/current converter of FIG. 5 to form a voltage controlled oscillator.
Figure 7:
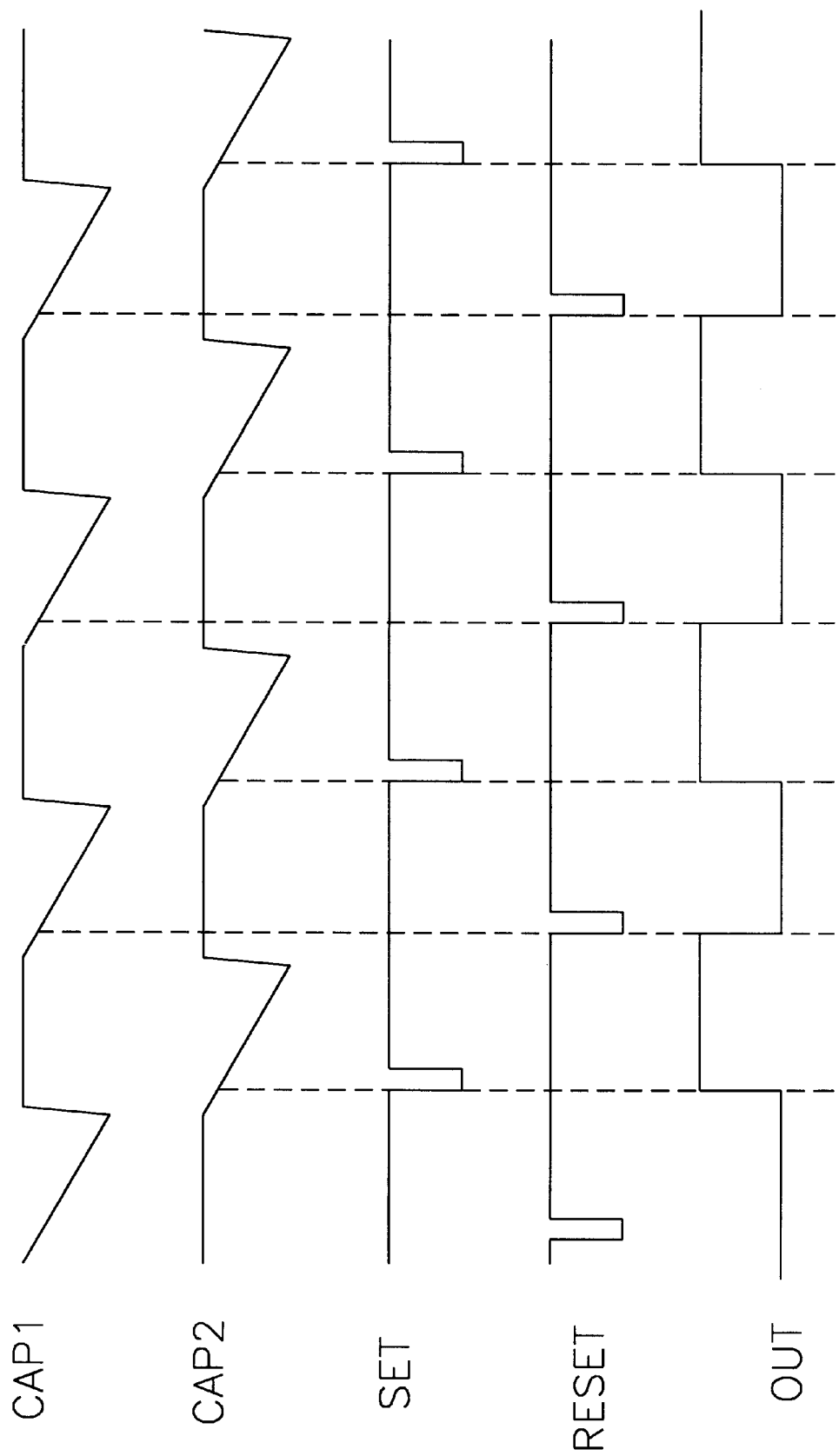
FIG. 7 illustrates a timing chart of various signals in the circuit shown in FIG. 6.

Each of the aforementioned preferred embodiments of the voltage controlled oscillator is composed of the voltage/current converter shown in FIG. 5 and the current controlled oscillator shown in FIG. 6 in cascade connection. The voltage/current converter of FIG. 5 is used for converting the input voltage Vin into current I=Vin/R; the current I is then used as the input of the current controlled oscillator shown in FIG. 6. The operation of the current controlled oscillator shown in FIG. 6 can be illustrated with reference to FIG. 7 hereinafter: (1) if the states of the switching elements 61 and 62 are as shown in FIG. 6, since the MOSFET capacitor $C_2$ is discharged, the potential of CAP2 starts to descend until it is lower than Vth, and the output SET of the comparator 64 becomes low, which subsequently makes the output signal OUT become high; (2) if the two switching elements 61 and 62 are connected in the following way: the gate of the MOSFET 65 is connected to the input current Iin and the gate of the MOSFET 66 is connected to the positive supply voltage Vcc; the potential of CAP1 starts to decrease until it is lower than Vth and the output RESET of the comparator 63 becomes low, which subsequently makes the output signal OUT become low. Theoretically, the capacitor $C_1$ or $C_2$ is discharged at a time rate of dV/dt=(dQ/dt)/C=Iin/C.

Therefore, the MOSFET can be operated in the saturation region by selecting Vth adequately, which means the MOSFET has an almost constant capacitance. It is to be noted that the output signal OUT is a pulse train whose frequency is directly proportional to Iin. In other words, it is directly proportional to Vin.

The errors in the CMOS analog-to-digital converter shown in FIG. 1, FIG. 2 or FIG. 3 can be further removed by some correction circuits as described hereinafter.

FIG. 8A shows a linearity correction circuit for correcting linearity errors of the readout values, which includes: a programmable shifter 81 which receives a readout value and a shift control signal SC for determining the number of shift bit; and an adder/subtractor 82 which receives the readout value, the output of the programmable shifter 81, and an addition/subtraction control signal A/S C for determining addition or subtraction of the two input values is performed. The output of the adder/subtractor 82 is the digital signal with linearity errors removed.

FIG. 8B illustrates an offset correction circuit for correcting offset errors of the readout value, which includes: an adder/subtractor 82 which receives the readout value, an offset correction code OCC and an addition/subtraction control signal A/S C for determining addition or subtraction of the two input values is performed. The output of the adder/subtractor 82 is the digital signal with offset errors removed.

FIG. 8C shows a look-up table correction circuit with a built-in table for correcting non-linear errors.

The above correction circuits can be applied to different situations, respectively. Specifically, the linearity correction circuit is used for correcting errors in the reference voltage Vref and errors in component matching; the offset correction circuit is used for correcting offset associated with op amps and other digital circuits; the look-up correction circuit is used for correcting other non-linear errors.

Utilizing the aforementioned analog-to-digital converters, one can design a CMOS temperature sensing device for detecting slow-varying temperatures, as described hereinafter. First, an analog voltage directly proportional to the absolute temperature is generated, then such an analog voltage is input to any of the aforementioned analog-to-digital converters; the output signal of the analog-to-digital converter represents a digital signal corresponding with the absolute temperature to be measured.

Figure 9:
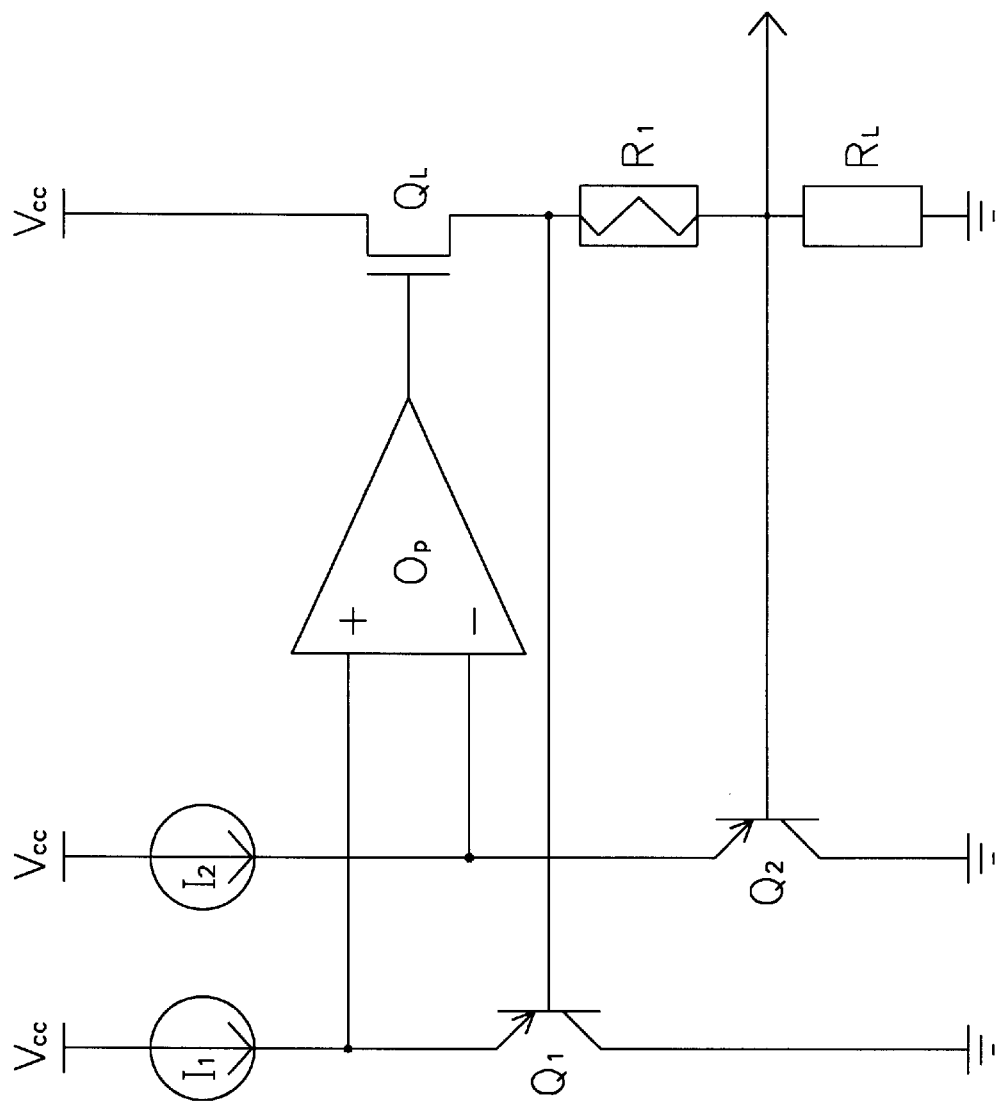
FIG. 9 shows the first preferred embodiment of a voltage generating circuit for generating an analog voltage representing temperature in a CMOS temperature sensing device according to the present invention.

FIG. 9 illustrates a circuit for generating an analog voltage directly proportional to the absolute temperature, which includes: two parasitic bipolar transistors, Q1 and Q2; two constant current sources, I1 and I2; an operational amplifier Op; a load NMOS transistor $Q_L$; a resistor RI and a load resistor R2 which matches the resistor R1. The emitter currents Ie1 and Ie2 of the transistors Q1 and Q2 can be expressed, respectively, as follows:

$$Ie1 = Is1 \times (\exp(V_{be}1/(k \times T/q))) \quad (5)$$

$$Ie2 = Is2 \times (\exp(V_{be}2/(k \times T/q))) \quad (6)$$

wherein Is1 and Is2, representing saturation currents of the transistors Q1 and Q2, respectively, are directly proportional to the junction areas. Assume that the ratio of the junction areas of the transistors Q1 and Q2 is N:1, and the ratio of the constant current sources I1 and I2 is M:1, then $$Ie1/Ie2 = M = N \times (\exp(V_{be}1/(k \times T/q)))/(\exp(V_{be}2/(k \times T/q))).$$

Taking nature log on both sides and rearranging the terms results in:

$$\ln(M) - \ln(N) = (V_{be}1 - V_{be}2)/(k \times T/q),$$

which can be rearranged again to become:

$$V_{be}1 - V_{be}2 = T \times (k/q) \times \ln(M/N). \quad (7)$$

Namely, $\Delta V_{be}$ is directly proportional to absolute temperature T. Since the emitters of the two transistors Q1 and Q2 are connected to the two input terminals of the operational amplifier Op, respectively, $\Delta V_{be}$ is equivalent to the potential across the two ends of the resistor R1. By adequately selecting M and N, $\Delta V_{be}$ can be amplified to a few tenths of a volt. The potential at the positive end of the load resistor $R_L$ can be expressed in terms of $\Delta V_{be}$ as;

$$\Delta V_{be} \times \frac{R_L}{R1};$$

by adequately selecting the resistance ratio of the load resistor $R_L$ to resistor R1, a potential V2 of proper magnitude can be obtained, which is suitable to be the input to the analog-to-digital converter.

Figure 10:
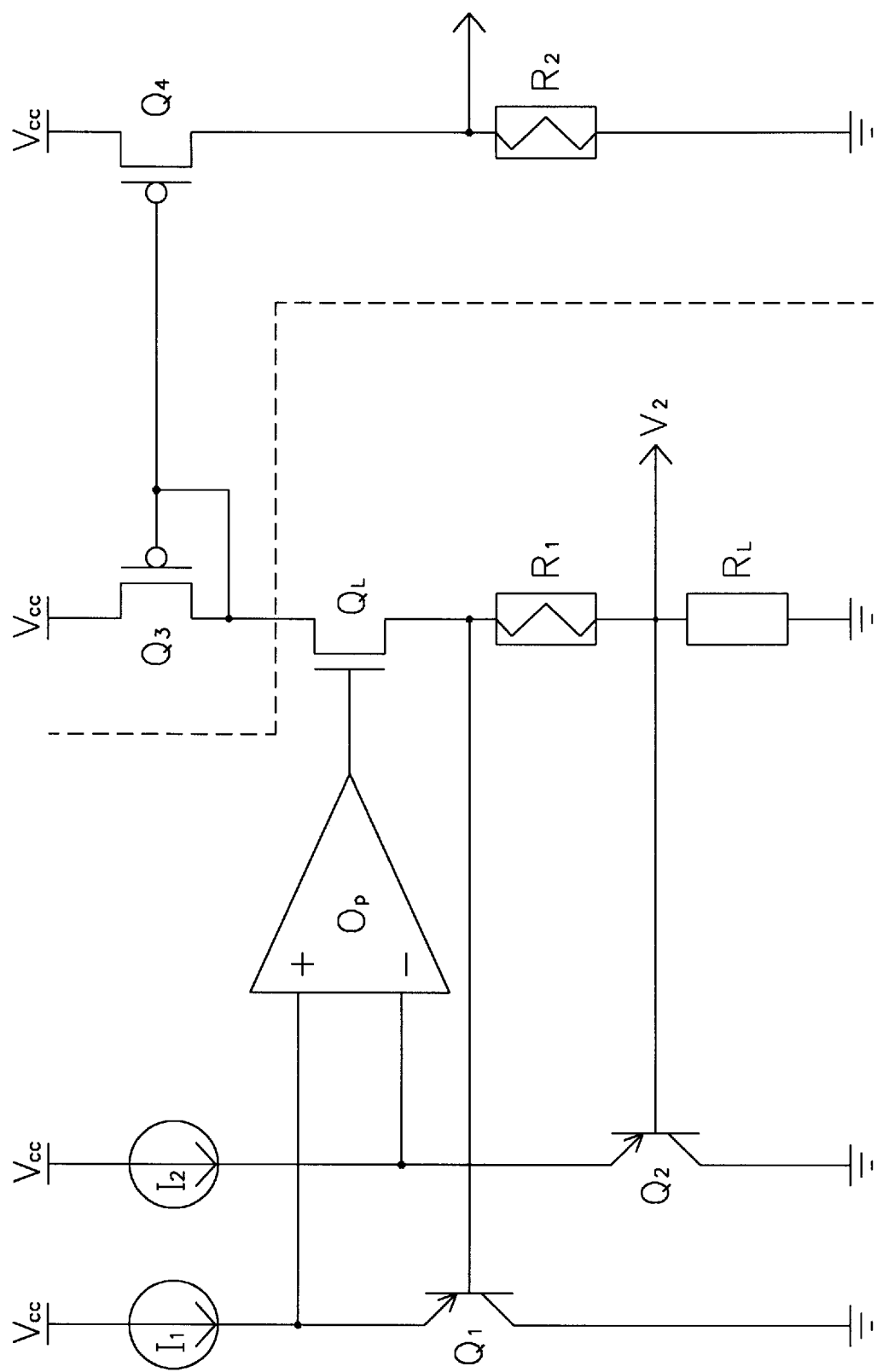
FIG. 10 shows the second preferred embodiment of a voltage generating circuit for generating an analog voltage representing temperature in a CMOS temperature sensing device according to the present invention.

FIG. 10 shows another circuit for generating an analog voltage directly proportional to the absolute temperature, which is similar to FIG. 9 with the exception that a voltage amplification section (the upper right corner of FIG. 10) is added. The voltage amplification section is composed of the following elements: two PMOS transistors, Q3 and Q4, constituting a current mirror, and a resistor R2 matching the resistor R1. Incorporating this voltage amplification section, further amplified potential can be obtained at the positive end of the resistor R2, which is $$V2 \times \frac{R2}{R_L} \times \frac{\text{the ratio of width to length of the PMOS transistor } Q4}{\text{the ratio of width to length of the PMOS transistor } Q3}.$$

While the invention has been particularly shown and described with

While the invention has been particularly shown and described with reference to the preferred embodiments thereof, it will be understood by those skilled in the art that various changes in form and details may be made without departing from the spirit and scope of the invention.

What is claimed is:

1. An analog-to-digital converter for converting slow-varying analog voltage signals into digital signals, comprising:

first and second analog multiplexers; said first analog multiplexer receiving an input voltage Vin and a reference voltage Vref, and being controlled by a control signal Phase, said second analog multiplexer also receiving said signals Vin and Vref, and being controlled by the complement of said signal Phase, such that while said control signal Phase is high, the output signals of said first and second analog multiplexers are Vin and Vref respectively, while said control signal Phase is low; the output signals of said first and second analog multiplexers are Vref and Vin, respectively;

first and second voltage controlled oscillators; said first and second voltage controlled oscillators receiving the output signals of said first and second analog multiplexers, respectively, and outputting said first and second pulse trains P1 and P2, respectively;

first and second digital multiplexers; said first digital multiplexer receiving said pulse trains P1 and P2, and being controlled by said control signal Phase, said second digital multiplexer also receiving said pulse trains P1 and P2, and being controlled by the complement of said signal Phase, such that while said control signal Phase is high, the output signals of said first and second digital multiplexers are P1 and P2, respectively, while said control signal Phase is low; the output signals of said first and second digital multiplexers are P2 and P1, respectively;

first and second counters; said first counter receiving the output signal of said first digital multiplexer, said second counter receiving the output signal of said second digital multiplexer; and a digital average circuit which receives the output signals of said first and second counters, and also receives said control signal Phase, said digital average circuit operating as described in the following: (1) said Phase being high, the count value of said first counter being stored whenever the count value of said second counter reaches a fixed number, then said two count values being reset to zero; (2) said Phase being low, the count value of said second counter being added to said stored count value of the first counter whenever the count value of said first counter reaches said fixed number, then the count values of said first and second counters being reset to zero after the sum is read, this readout count representing a digital signal corresponding to the input analog signal.

2. The CMOS analog-to-digital converter of claim 1, wherein each voltage controlled oscillator is composed of a voltage/current converter and a current controlled oscillator, said voltage/current converter converting said input analog voltage signal into an analog current signal which is input to said current controlled oscillator.

3. The CMOS analog-to-digital converter of claim 1, further comprising:
  a linearity correction circuit for correcting linearity error of said readout count, comprising:
  a programmable shifter which receives said readout count and a shift control signal SC for determining the number of shift bit; and
  an adder/subtractor which receives said readout count and the output of said programmable shifter, and also receives an addition/subtraction control signal for determining whether addition or subtraction of said two input signals is performed, the output thereof being a digital signal with linearity errors removed.

4. The CMOS analog-to-digital converter of claim 1, further comprising:
  an offset correction circuit for correcting offset error of said readout count, comprising:
  an adder/subtractor which receives said readout count and an offset correction code, and also receives an addition/subtraction control signal for determining whether addition or subtraction of said two input signals is performed, the output thereof being a digital signal with offset errors removed.

5. The CMOS analog-to-digital converter of claim 1, further comprising:
  a look-up table correction circuit for correcting non-linear errors, said look-up table correction circuit receiving said readout count and mapping said readout count to another value in accordance with a built-in look-up table to attain a digital signal with non-linear errors removed.

6. The CMOS analog-to-digital converter of claim 1, further comprising:
  sensing means for generating an analog voltage signal directly proportional to absolute temperature.

7. The CMOS analog-to-digital converter as claimed in claim 6, wherein said sensing means comprises:
  first and second parasitic bipolar transistors;
  first and second constant current sources;
  an operational amplifier;
  a load NMOS transistor;
  a first resistor; and
  a load resistor matching said first resistor,
  wherein the collectors of said first and second bipolar transistors are together connected to a low potential power source, with the emitters thereof connected, respectively, to the two input terminals of said operational amplifier and also connected to the terminals of said first and second constant current sources, respectively, the other terminals of said two constant current sources are together connected to a high potential power source, the bases of said first and second bipolar transistors are connected to the two ends of said first resistor, respectively, the output terminal of said operational amplifier is connected to the gate of said load NMOS transistor, the drain of said load NMOS transistor is connected to said high potential power source, with the source thereof connected to the positive end of said first resistor, the negative end of said first resistor is connected to the positive end of said load resistor whose negative end is grounded, the potential V1 appearing at the two ends of said first resistor is directly proportional to absolute temperature, and the potential V2 appearing at the positive end of said load resistor is equal $$V1 \times \frac{|\text{the load resistance}|}{|\text{the first resistance}|}$$

which represents temperature.

8. The CMOS analog-to-digital converter as claimed in claim 7, wherein said sensing means further comprises:
  a voltage amplification section for amplifying the output of said sensing means, said voltage amplification section comprising:
  first and second PMOS transistors forming a current mirror; and
  a second resistor matching said first resistor,
  wherein the sources of said first and second PMOS transistors are together connected to said high potential power source, the drain of said first PMOS transistor is connected to the drain of said load NMOS transistor, the drain of said second PMOS transistor is connected to the positive end of said second resistor, the negative end of said second resistor is grounded, and a further amplified voltage is obtained at the positive end of said second resistor, and defined by $$V2 \times \frac{|\text{the second resistance}|}{|\text{the load resistance}|} \times$$

$$\frac{|\text{the ration of width to length of the second } PMOS\,|}{|\text{the ratio of width to length of the first } PMOS\,|}.$$

9. An analog-to-digital converter for converting slow-varying analog voltage signals into digital signals, comprising:

a first voltage controlled oscillator for receiving an input analog voltage signal and converting said input analog voltage signal into a pulse train;

a first counter for counting the pulses of said pulse train when receiving said pulse train from said first voltage controlled oscillator;

a second voltage controlled oscillator for receiving a reference voltage signal and converting said reference voltage signal into a pulse train; and a second counter for counting the pulses of said pulse train when said pulse train input from said second voltage controlled oscillator, generating informing signals to said first counter when the count value of said second counter reaches a predetermined value, and then resetting said count value of said second counter to zero;

wherein the count value of said first counter is read and reset to zero in response to each of said informing signals from said second counter, and said read count value representing a digital signal corresponding to said input analog voltage signal.

* * * * *

UNITED STATES PATENT AND TRADEMARK OFFICE
CERTIFICATE OF CORRECTION

PATENT NO. : 6,111,533  
DATED : August 29, 2000  
INVENTOR(S) : Yuan et al.

Page 1 of 1

It is certified that error appears in the above-identified patent and that said Letters Patent is hereby corrected as shown below:

Please add the first-named inventor as follows:

[75] Inventors: Wei-Shang Chy, Hsin-Chu;

Signed and Sealed this

Third Day of July, 2001

*Attest:*

*Attesting Officer*

NICHOLAS P. GODICI  
*Acting Director of the United States Patent and Trademark Office*